US012581803B2

(12) United States Patent
Shin et al.

(10) Patent No.: US 12,581,803 B2
(45) Date of Patent: Mar. 17, 2026

(54) DISPLAY DEVICE AND METHOD OF MANUFACTURING THE SAME

(71) Applicant: SAMSUNG DISPLAY CO., LTD., Yongin-si (KR)

(72) Inventors: Hyuneok Shin, Yongin-si (KR); Joonyong Park, Yongin-si (KR); Juhyun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 404 days.

(21) Appl. No.: 18/232,475

(22) Filed: Aug. 10, 2023

(65) Prior Publication Data

US 2024/0244883 A1     Jul. 18, 2024

(30) Foreign Application Priority Data

Jan. 16, 2023     (KR) ........................ 10-2023-0006303

(51) Int. Cl.
| | |
|---|---|
| *H10K 59/121* | (2023.01) |
| *H10K 59/12* | (2023.01) |
| *H10K 59/80* | (2023.01) |
| *H10K 71/20* | (2023.01) |

(52) U.S. Cl.
CPC ..... *H10K 59/1213* (2023.02); *H10K 59/1201* (2023.02); *H10K 59/80518* (2023.02); *H10K 71/231* (2023.02)

(58) Field of Classification Search
CPC .............. H10K 59/1213; H10K 59/12; H10K 59/1201; H10K 71/231
See application file for complete search history.

(56) References Cited

U.S. PATENT DOCUMENTS

| | | | |
|---|---|---|---|
| 6,597,110 B1 | 7/2003 | Thompson et al. | |
| 7,510,455 B2 | 3/2009 | Suzuki | |
| 7,816,677 B2 | 10/2010 | Lee et al. | |
| 8,008,857 B2 | 8/2011 | Kim | |
| 9,318,725 B2 | 4/2016 | Li | |
| 2024/0389404 A1* | 11/2024 | Lee ...................... | H10K 59/131 |

FOREIGN PATENT DOCUMENTS

| | | |
|---|---|---|
| CN | 104272487 A | 1/2015 |
| KR | 1020050067055 | 6/2005 |
| KR | 100879294 B1 | 1/2009 |
| KR | 101458908 B1 | 11/2014 |

* cited by examiner

*Primary Examiner* — Joseph L Williams
(74) *Attorney, Agent, or Firm* — CANTOR COLBURN LLP

(57)     ABSTRACT

A display device includes a substrate, a pixel circuit layer disposed on the substrate and including at least one thin-film transistor, a first pixel electrode including a sub-conductive layer disposed on the pixel circuit layer, including a first conductive material, and electrically connected to the at least one thin-film transistor, a first reflective layer disposed on the sub-conductive layer and including a second conductive material, an inorganic insulating layer disposed on the first reflective layer, and a first transparent electrode layer covering an upper surface of the inorganic insulating layer and electrically connected to the sub-conductive layer, and a second pixel electrode including a second reflective layer disposed on the pixel circuit layer and including the second conductive material, and a second transparent electrode layer disposed on the second reflective layer, where the second pixel electrode is apart from the first pixel electrode in a plan view.

23 Claims, 11 Drawing Sheets

FIG. 10

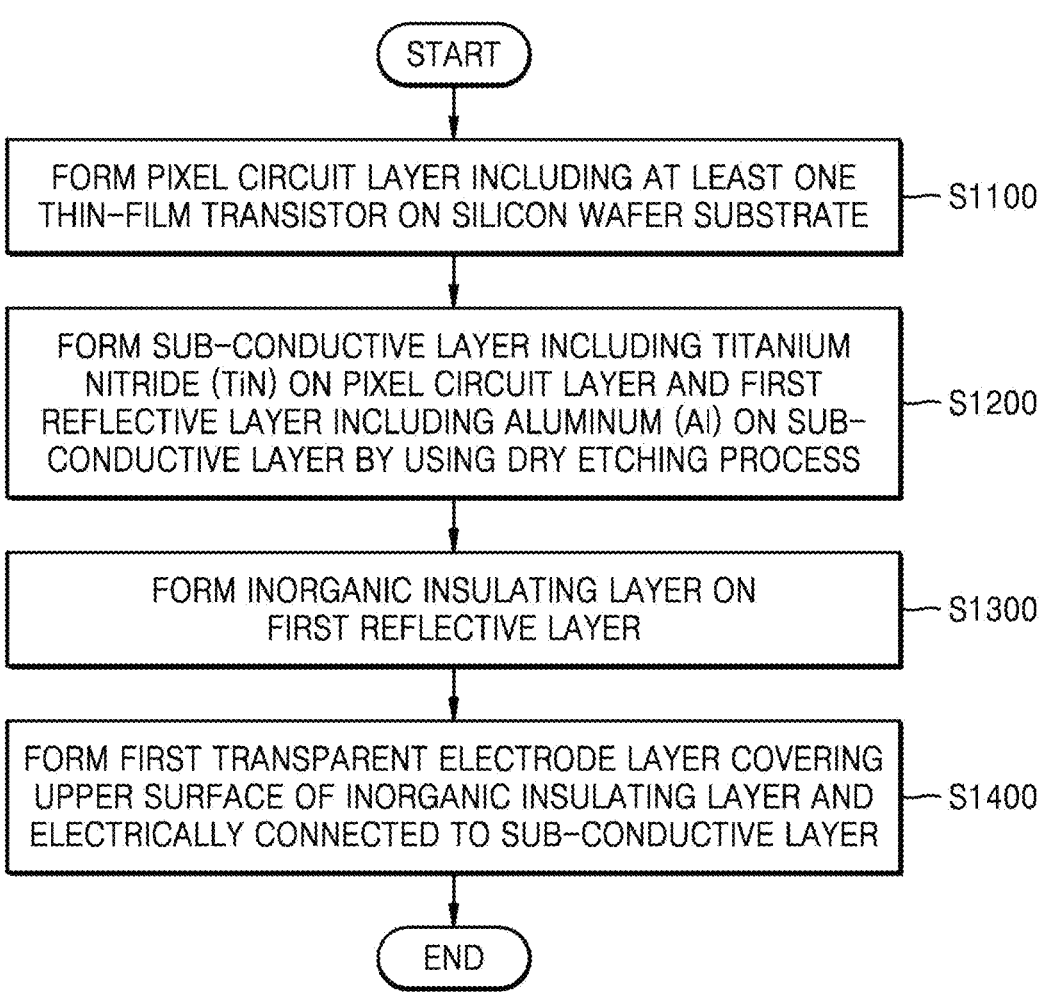

START

FORM PIXEL CIRCUIT LAYER INCLUDING AT LEAST ONE THIN-FILM TRANSISTOR ON SILICON WAFER SUBSTRATE — S1100

FORM SUB-CONDUCTIVE LAYER INCLUDING TITANIUM NITRIDE (TiN) ON PIXEL CIRCUIT LAYER AND FIRST REFLECTIVE LAYER INCLUDING ALUMINUM (Al) ON SUB-CONDUCTIVE LAYER BY USING DRY ETCHING PROCESS — S1200

FORM INORGANIC INSULATING LAYER ON FIRST REFLECTIVE LAYER — S1300

FORM FIRST TRANSPARENT ELECTRODE LAYER COVERING UPPER SURFACE OF INORGANIC INSULATING LAYER AND ELECTRICALLY CONNECTED TO SUB-CONDUCTIVE LAYER — S1400

END

FORM TiN LAYER ON PIXEL CIRCUIT LAYER —— S1210

FORM Al LAYER ON TiN LAYER —— S1220

APPLY DRY ETCHING PROCESS BASED ON CHLORINE (Cl)–BASED ETCHING GAS TO TiN LAYER AND Al LAYER —— S1230

DISPLAY DEVICE AND METHOD OF MANUFACTURING THE SAME

This application claims priority to Korean Patent Application No. 10-2023-0006303, filed on Jan. 16, 2023, and all the benefits accruing therefrom under 35 U.S.C. § 119, the content of which in its entirety is herein incorporated by reference.

BACKGROUND

1. Field

One or more embodiments relate to a display device, and more particularly, to a display device suitable for a dry etching process to implement ultra-high resolution and a method of manufacturing the display device.

2. Description of the Related Art

A display device receives information about an image and displays the image. A display device is widely used as a display for a small product such as a mobile phone or a display for a large product such as a television.

A display device typically includes a plurality of pixels that emit light by receiving an electrical signal to display an image to the outside. Each pixel may include a light-emitting device. For example, an organic light-emitting display device includes an organic light-emitting diode (OLED) as a light-emitting device. In general, in an organic light-emitting display device, a thin-film transistor and an OLED are formed on a substrate, and the OLED emits light by itself.

A display device for displaying a full-color image by using an OLED may employ an optical resonance structure in which an optical length of each wavelength emitted from an emission layer of each pixel having a different color is changed.

SUMMARY

One or more embodiments include a display device suitable for a dry etching process in order to implement ultra-high resolution and a method of manufacturing the display device.

According to one or more embodiments, a display device includes a substrate, a pixel circuit layer disposed on the substrate and including at least one thin-film transistor, a first pixel electrode including a sub-conductive layer disposed on the pixel circuit layer, and electrically connected to the at least one thin-film transistor, where the sub-conductive layer includes a first conductive material, a first reflective layer disposed on the sub-conductive layer, where the first reflective layer includes a second conductive material, an inorganic insulating layer disposed on the first reflective layer, and a first transparent electrode layer covering an upper surface of the inorganic insulating layer and electrically connected to the sub-conductive layer, and a second pixel electrode including a second reflective layer disposed on the pixel circuit layer, where the second reflective layer includes the second conductive material, and a second transparent electrode layer disposed on the second reflective layer, where the second pixel electrode is apart from the first pixel electrode when viewed in a direction perpendicular to the substrate.

In an embodiment, the first conductive material may include titanium nitride (TiN).

In an embodiment, the second conductive material may include aluminum (Al).

In an embodiment, the first transparent electrode layer may directly contact an outer surface of the sub-conductive layer.

In an embodiment, the first transparent electrode layer may entirely cover the outer surface of the sub-conductive layer.

In an embodiment, the first transparent electrode layer may directly contact an outer surface of the first reflective layer.

In an embodiment, the first transparent electrode layer may entirely cover the outer surface of the first reflective layer.

In an embodiment, the first reflective layer may include aluminum oxide ($Al_2O_3$) distributed along an outer surface of the first reflective layer.

In an embodiment, the first transparent electrode layer may directly contact an outer surface of the inorganic insulating layer.

In an embodiment, the first transparent electrode layer may entirely cover the outer surface of the inorganic insulating layer.

In an embodiment, when viewed in the direction perpendicular to the substrate, the upper surface of the inorganic insulating layer may be disposed inside an upper surface of the first reflective layer.

In an embodiment, when viewed in the direction perpendicular to the substrate, the upper surface of the first reflective layer may be disposed inside an upper surface of the sub-conductive layer.

In an embodiment, a distance between an upper surface of the substrate and an upper surface of the first transparent electrode layer may be greater than a distance between the upper surface of the substrate and an upper surface of the second transparent electrode layer.

In an embodiment, the first reflective layer and the second reflective layer may include an aluminum-titanium alloy (Al—Ti alloy).

In an embodiment, the inorganic insulating layer may include silicon oxide ($SiO_2$) or silicon nitride ($SiN_x$).

In an embodiment, the first reflective layer and the sub-conductive layer may have a patterned shape formed by a dry etching process using a chlorine (Cl)-based etching gas.

In an embodiment, the substrate may include a semiconductor substrate.

In an embodiment, the first reflective layer may be apart from the pixel circuit layer in the direction perpendicular to the substrate.

In an embodiment, the first reflective layer may be apart from the pixel circuit layer by a thickness of the sub-conductive layer.

In an embodiment, the display device may further include a first emission layer disposed on the first pixel electrode, and a second emission layer disposed on the second pixel electrode, wherein a distance between the first emission layer and an upper surface of the substrate may be greater than a distance between the second emission layer and the substrate.

According to one or more embodiments, a method of manufacturing a display device includes forming, on a silicon wafer substrate, a pixel circuit layer including at least one thin-film transistor, forming a sub-conductive layer including titanium nitride (TiN) on the pixel circuit layer and a first reflective layer including aluminum (Al) on the sub-conductive layer by using a dry etching process, forming an inorganic insulating layer on the first reflective layer, and forming a first transparent electrode layer covering an upper surface of the inorganic insulating layer and electrically connected to the sub-conductive layer.

In an embodiment, the forming the sub-conductive layer and the first reflective layer may include performing the dry etching process based on a chlorine (Cl)-based etching gas.

In an embodiment, the forming the sub-conductive layer and the first reflective layer may include forming a TiN layer on the pixel circuit layer, forming an Al layer on the TiN layer, and applying the dry etching process based on the Cl-based etching gas to the TiN layer and the Al layer.

BRIEF DESCRIPTION OF THE DRAWINGS

The above and other features of certain embodiments of the disclosure will be more apparent from the following description taken in conjunction with the accompanying drawings, in which:

FIG. 10 is a flowchart illustrating a method of manufacturing a display device, according to an embodiment of the invention.

DETAILED DESCRIPTION

Figure 1:
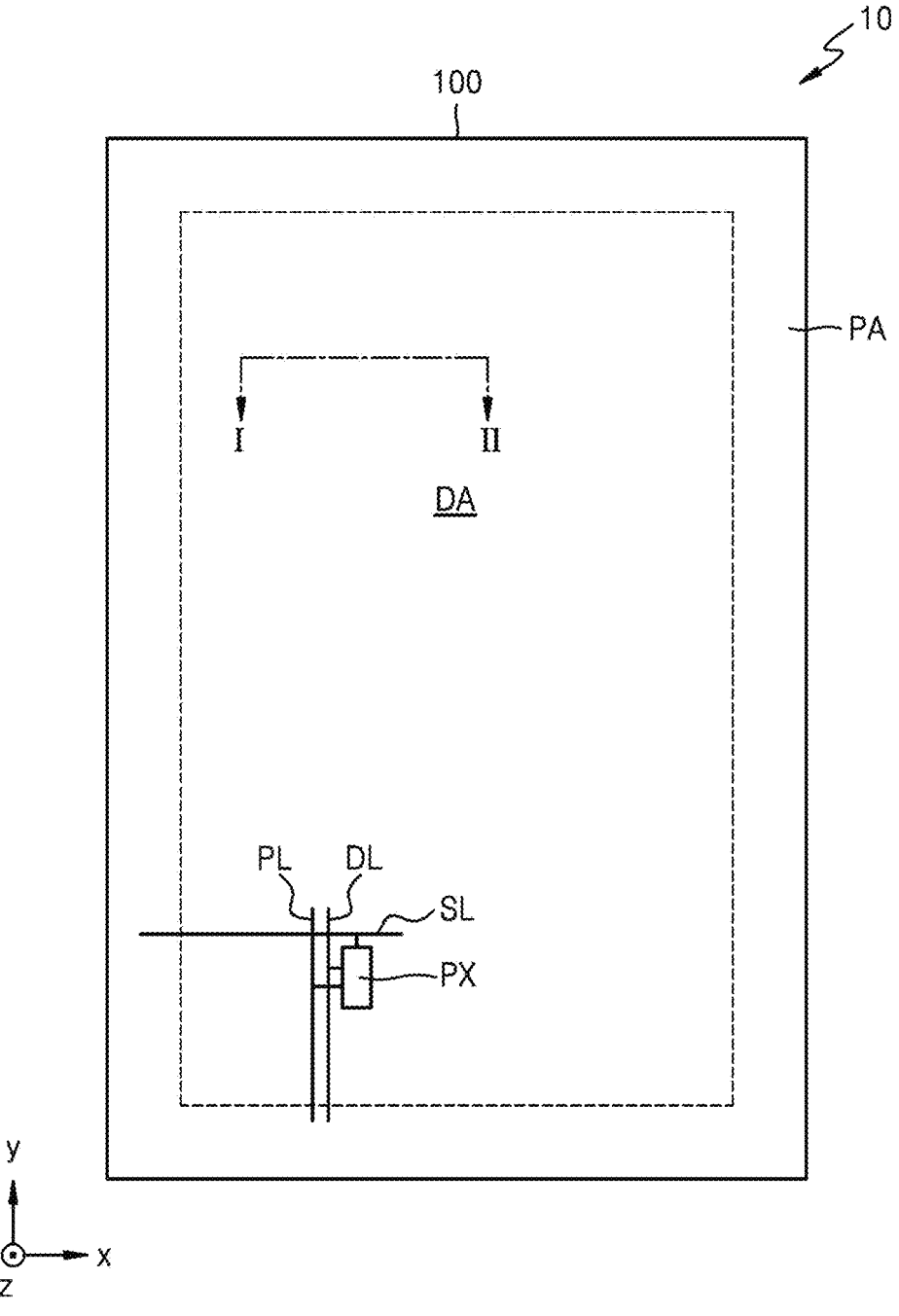
FIG. 1 is a plan view schematically illustrating a display panel included in a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" or "at least one selected from a, b and c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings, wherein the same or corresponding elements are denoted by the same reference numerals throughout and any repetitive detailed description thereof may be omitted or simplified.

It will be understood that when a component, such as a layer, a film, a region, or a plate, is referred to as being "on" another component, the component may be directly on the other component or intervening components may be present therebetween. Also, sizes of components in the drawings may be exaggerated or contracted for convenience of explanation. For example, because sizes and thicknesses of elements in the drawings are arbitrarily illustrated for convenience of explanation, the disclosure is not limited thereto.

In the following embodiments, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a plan view schematically illustrating a display panel included in a display device according to an embodiment.

As shown in FIG. 1, a display device according to an embodiment may include a display panel 10. The display device may be any display device or electronic device as long as it includes the display panel 10. In an embodiment, for example, the display device may be any of various apparatuses such as a smartphone, a tablet, a laptop, a television, or a billboard. The display device according to an embodiment includes thin-film transistors and a capacitor, and the thin-film transistors and the capacitor may be implemented by conductive layers and insulating layers.

In an embodiment, the display panel 10 includes a display area DA and a peripheral area PA located outside the display area DA. In an embodiment, as shown in FIG. 1, the display area DA has a rectangular shape. However, the disclosure is not limited thereto. The display area DA may have any of other various shapes such as a circular shape, an elliptical shape, a polygonal shape, or a specific shape.

The display area DA is a portion where an image is displayed, and a plurality of pixels PX may be located in the display area DA. Each pixel PX may include a display device such as an organic light-emitting diode. Each pixel PX may emit, for example, red light, green light, or blue light. The pixel PX may be connected to a pixel circuit including a thin-film transistor TFT and a storage capacitor. The pixel circuit may be connected to a scan line SL that transmits a scan signal, a data line DL that intersects the scan line SL and transmits a data signal, and a driving voltage line PL that supplies a driving voltage. The scan line SL may extend in an x-direction (hereinafter, referred to as a second direction), and the data line DL and the driving voltage line PL may extend in a y-direction (hereinafter, referred to as a first direction). Here, a z-direction (hereinafter, referred to as a third direction) perpendicular to the first and second directions, may be a thickness direction of the display panel 10.

The pixel PX may emit light having a luminance corresponding to an electrical signal from the pixel circuit that is electrically connected. The display area DA may display a certain image through light emitted from the pixel PX. For reference, the pixel PX may be defined as an emission area that emits light of one color selected from red, green, and blue as described above.

The peripheral area PA is a portion where the pixel PX is not located and an image is not displayed. In the peripheral area PA, a power supply wiring for driving the pixel PX may be located. Also, in the peripheral area PA, pads may be located, and an integrated circuit device such as a driver IC or a printed circuit board including a driving circuit unit may be electrically connected to the plurality of pads.

In an embodiment, where the display panel 10 includes a substrate 100, the substrate 100 may include the display area DA and the peripheral area PA. The substrate 100 will be described below in detail.

In an embodiment, a plurality of transistors may be located in the display area DA. In the plurality of transistors, a first terminal of a transistor may be a source electrode or a drain electrode, and a second terminal thereof may be an electrode different from the first terminal, according to a type (N-type or P-type) and/or an operating condition of the transistor. In an embodiment, for example, the first terminal may be a source electrode, and the second terminal may be a drain electrode.

The plurality of transistors may include a driving transistor, a data write transistor, a compensation transistor, an initialization transistor, and an emission control transistor. The driving transistor may be connected between the driving voltage line PL and an organic light-emitting diode OLED (see FIG. 2), and the data write transistor may be connected to the data line DL and the driving transistor, and may perform a switching operation of transmitting a data signal transmitted through the data line DL.

The compensation transistor may be turned on in response to a scan signal received through the scan line S to connect the driving transistor to the organic light-emitting diode OLED and compensate for a threshold voltage of the driving transistor.

The initialization transistor may be turned on in response to a scan signal received through the scan line SL to transmit an initialization voltage to a gate electrode of the driving transistor and initialize the gate electrode of the driving transistor. The scan line connected to the initialization transistor may be a scan line different from the scan line connected to the compensation transistor.

The emission control transistor may be turned on in response to an emission control signal received through an emission control line, and thus, driving current may flow through the organic light-emitting diode OLED.

The organic light-emitting diode OLED may include a pixel electrode (anode) and a opposite electrode (cathode), and the opposite electrode may receive a second power supply voltage ELVSS. The organic light-emitting diode OLED may receive the driving current from the driving transistor to emit light and display an image.

Hereinafter, although an organic light-emitting display device is described as a display device according to an embodiment, the display device of the disclosure is not limited thereto. In an alternative embodiment, the display device may be an inorganic light-emitting display device or an inorganic electroluminescent (EL) display device, or a quantum dot light-emitting display device. For example, an emission layer of a display device included in the display device may include an organic material or an inorganic material. Also, the display device may include an emission layer, and quantum dots located in a path of light emitted from the emission layer.

Figure 2:
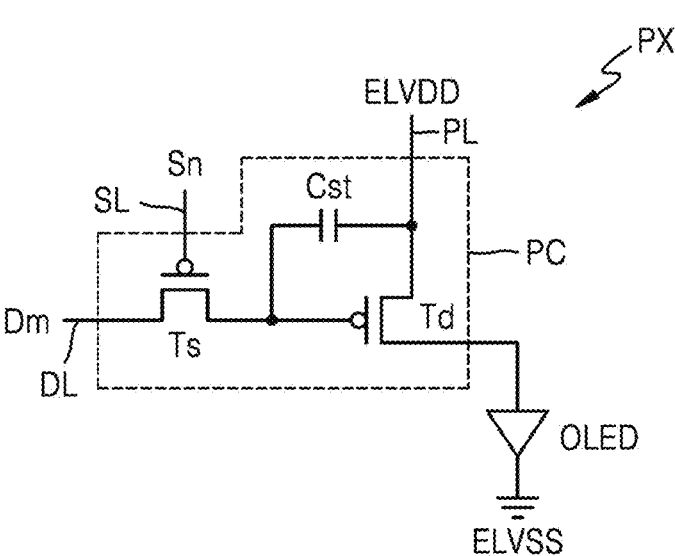
FIG. 2 is an equivalent circuit diagram of an embodiment of a pixel included in the display panel of FIG. 1.

FIG. 2 is an equivalent circuit diagram of an embodiment of a pixel included in the display panel of FIG. 1.

As shown in FIG. 2, each pixel PX includes a pixel circuit PC connected to the scan line SL and the data line DL, and an organic light-emitting diode OLED connected to the pixel circuit PC. The pixel circuit PC includes a driving thin-film transistor Td, a switching thin-film transistor Ts, and a storage capacitor Cst. The switching thin-film transistor Ts is connected to the scan line SL and the data line DL, and transmits a data signal Dm input through the data line DL to the driving thin-film transistor Td based on a scan signal Sn input through the scan line SL.

The storage capacitor Cst is connected to the switching thin-film transistor Ts and the driving voltage line PL, and stores a voltage corresponding to a difference between a voltage received from the switching thin-film transistor Ts and a first power supply voltage ELVDD supplied to the driving voltage line PL. The second power supply voltage ELVSS may be a driving voltage having a lower level than the first power supply voltage ELVDD. A level of a driving voltage supplied to each pixel PX may be a difference between a level of the first power supply voltage ELVDD and a level of the second power supply voltage ELVSS.

The driving thin-film transistor Td may be connected to the driving voltage line PL and the storage capacitor Cst, and may control driving current flowing through the organic light-emitting diode OLED from the driving voltage line PL in response to a value of the voltage stored in the storage capacitor Cst. The organic light-emitting diode OLED may emit light having a certain luminance corresponding to the driving current.

Figure 3:
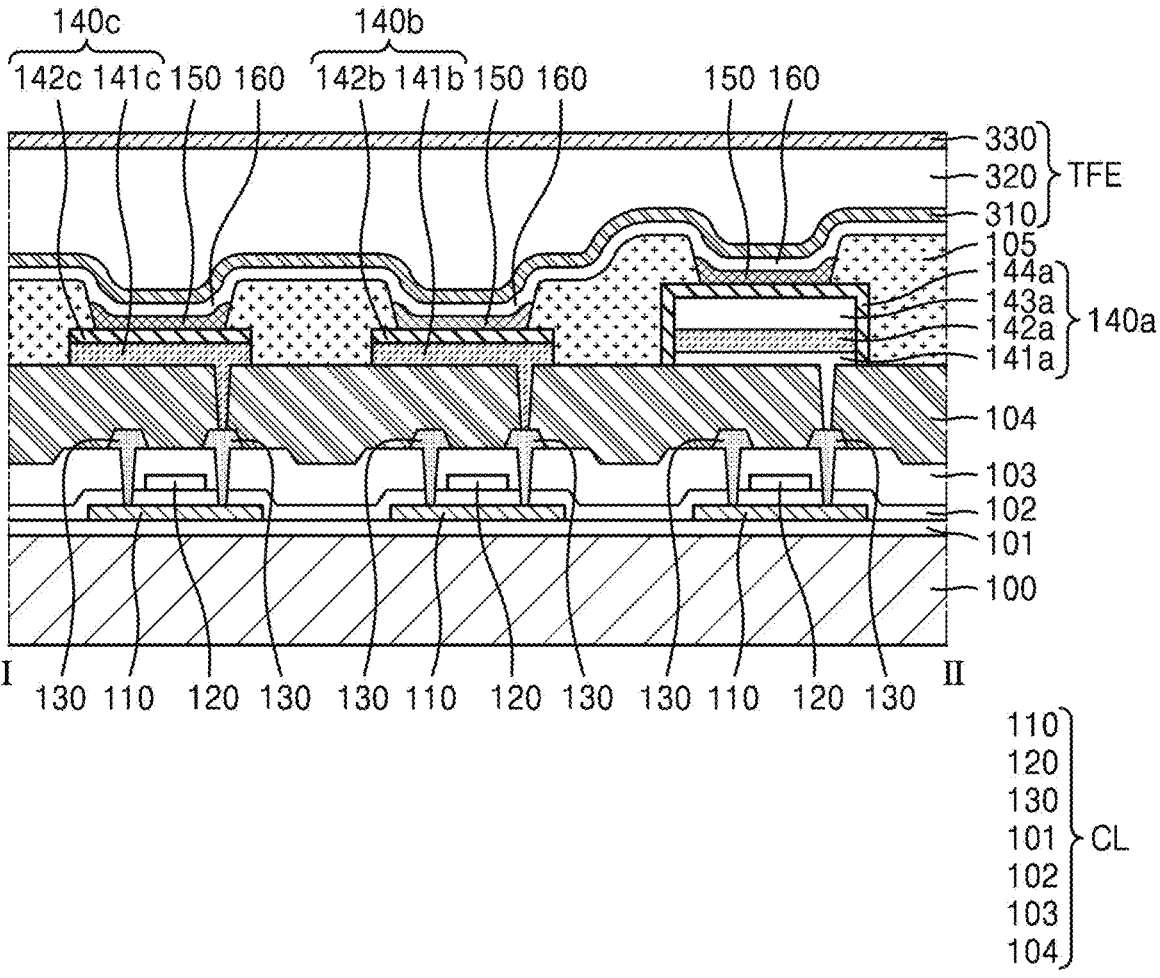
FIG. 3 is a schematic cross-sectional view taken along line I-II of the display panel of FIG. 1 mainly illustrating a pixel electrode according to an embodiment of the invention.

FIG. 3 is a schematic cross-sectional view taken along line I-II of the display panel of FIG. 1, mainly illustrating a pixel electrode according to an embodiment of the invention.

The substrate 100 may include portions corresponding to the display area DA and the peripheral area PA outside the display area, as described above. The substrate 100 may include at least one selected from various materials that are flexible or bendable.

In an embodiment, the substrate 100 included in the display device may include a semiconductor material, for example, a group IV semiconductor, a group III-V compound semiconductor, or a group II-VI compound semiconductor to implement ultra-high resolution. The substrate 100 may include a silicon layer. In such an embodiment, the substrate 100 may be a semiconductor substrate including a semiconductor material. As such, an organic light-emitting diode (OLED) display using the substrate 100 including a semiconductor material may be referred to as OLED on Silicon (OLEDoS). OLEDoS may be mainly used for extended reality (XR), etc., and may implement an ultra-high definition of 8K or higher within a small area of around 1 to 2 inches. In the case of using a semiconductor substrate, it may be possible to closely control pixels arranged in ultra-high resolution.

In some cases, the type of substrate 100 may not be limited to a semiconductor substrate. In an embodiment, for example, the substrate 100 may include glass, a metal, or a polymer resin. In an embodiment, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. However, various modifications may be made. In an embodiment, for example, the substrate 100 may have a multi-layer structure including two layers each including a polymer resin and a barrier layer including an inorganic material (e.g., silicon oxide, silicon nitride, or silicon oxynitride) and located between the two layers.

A buffer layer 101 may be located (or disposed) on the substrate 100. The buffer layer 101 may serve as a barrier layer and/or a blocking layer for preventing diffusion of impurity ions, preventing penetration of moisture or external air, and planarizing a surface. The buffer layer 101 may include silicon oxide, silicon nitride, or silicon oxynitride. Also, the buffer layer 101 may adjust a heat supply rate during a crystallization process for forming a semiconductor layer 110 so that the semiconductor layer 110 is uniformly crystalized.

The semiconductor layer 110 may be located on the buffer layer 101. The semiconductor layer 110 may be formed of polysilicon, and may include a channel region not doped with impurities and a source region and a drain region on opposing sides of the channel region and doped with impurities. The impurities may vary according to a type of a thin-film transistor, and may be N-type impurities or P-type impurities.

A gate insulating film 102 may be located on the semiconductor layer 110. The gate insulating film 102 may be an element for ensuring insulation between the semiconductor layer 110 and a gate layer 120. The gate insulating film 102 may include an inorganic material such as silicon oxide, silicon nitride, and/or silicon oxynitride, and may be located between the semiconductor layer 110 and the gate layer 120. Also, the gate insulating film 102 may be provided or formed to correspond to an entire surface of the substrate 100, and may have a structure in which contact holes are defined or formed at pre-set portions. As such, an insulating film including an inorganic material may be formed by using chemical vapor deposition (CVD) or atomic layer deposition (ALD). Such features may be applied to embodiments described below and modifications thereof.

The gate layer 120 may be located on the gate insulating film 102. The gate layer 120 may vertically overlap the semiconductor layer 110, and may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (W).

In such an embodiment, the semiconductor layer 110, the gate insulating film 102, and the gate layer 120 may form (constitute or collectively define) at least one selected from the thin-film transistors described above with reference to FIG. 2. According to a pattern having a preset shape, the semiconductor layer 110, the gate insulating film 102, and the gate layer 120 may form at least one thin-film transistor selected from the thin-film transistors described above with reference to FIG. 2.

An interlayer insulating film 103 may be located on the gate layer 120. The interlayer insulating film 103 may cover the gate layer 120. The interlayer insulating film 103 may include or be formed of an inorganic material. In an embodiment, for example, the interlayer insulating film 103 may include or be formed of a metal oxide or a metal nitride. In such an embodiment, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$). In some embodiments, the interlayer insulating film 103 may have a double structure formed of SiOx/SiNy or SiNx/SiOy.

A conductive layer 130 may be located on the interlayer insulating film 103. The conductive layer 130 may function as an electrode connected to the source/drain region of the semiconductor layer 110 through a through-hole defined or formed in the interlayer insulating film 103. The conductive layer 130 may include at least one metal selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). In an embodiment, for example, the conductive layer 130 may include a Ti layer, an Al layer, and/or a Cu layer.

An organic insulating layer 104 may be located on the conductive layer 130. The organic insulating layer 104 may be an organic insulating layer functioning as a planarization film covering the conductive layer 130 and having a substantially flat top surface. The organic insulating layer 104 may include, for example, an organic material such as acryl, benzocyclobutene (BCB), or hexamethyldisiloxane (HMDSO). In such an embodiment, various modifications may be made. In an embodiment, for example, the organic insulating layer 104 may have a single or multi-layer structure.

In an embodiment, although not shown in FIG. 3, an additional conductive layer and an additional insulating layer may be located between the conductive layer 130 and a pixel electrode, and may be applied to various embodiments. In such an embodiment, the additional conductive layer and the conductive layer 130 may include a same material as each other and may have a same layer structure as each other. The additional insulating layer and the organic insulating layer may include a same material as each other and may have a same layer structure as each other.

In an embodiment, a pixel circuit layer CL, which includes the semiconductor layer 110, the gate insulating film 102, the gate layer 120, the interlayer insulating film 103, the conductive layer 130, and the organic insulating layer 104, may be defined. In such an embodiment, the pixel circuit layer CL may be defined as a term referring to layers disposed between the substrate 100 described above and the pixel electrode described below, and may be used for convenience of description.

Pixel electrodes 140a, 140b, and 140c may be disposed on the pixel circuit layer CL. In an embodiment, the pixel electrodes 140a, 140b, and 140c may be located on the organic insulating layer 104 disposed in the uppermost portion of the pixel circuit layer CL. The pixel electrodes 140a, 140b, and 140c may be connected to the conductive layer 130 through contact holes defined or formed in the organic insulating layer 104. A display element may be located on each of the pixel electrodes 140a, 140b, and 140c. An organic light-emitting diode OLED may be used as a display element. In such an embodiment, the organic light-emitting diode OLED may be disposed on, for example, each of the pixel electrodes 140a, 140b, and 140c. The pixel electrodes 140a, 140b, and 140c may include a light-transmitting conductive layer including or formed of a light-transmitting conductive oxide, such as indium tin oxide (ITO), $In_2O_3$, or indium zinc oxide (IZO), and a reflective layer including or formed of a metal, such as Al or Ag.

In an embodiment, as shown in FIG. 3, the pixel electrodes 140a, 140b, and 140c may include a first pixel electrode 140a, a second pixel electrode 140b, and a third pixel electrode 140c. Each of the pixel electrodes 140a, 140b, and 140c may be apart from each other when viewed in a direction perpendicular to the substrate 100, that is, a thickness direction of the substrate 100 (or the third direction).

The first pixel electrode 140a may include a sub-conductive layer 141a, a first reflective layer 142a, an inorganic insulating layer 143a, and a first transparent electrode layer 144a. The sub-conductive layer 141a may be disposed on the substrate 100 or the organic insulating layer 104. The sub-conductive layer 141a may be connected to the conductive layer 130 through a through hole defined through the organic insulating layer 104. In other words, the sub-conductive layer 141a may be connected to the conductive layer 130 through the through hole and to the semiconductor layer 110 through the conductive layer 130. That the sub-conductive layer 141a is connected to the semiconductor layer 110 may mean that the sub-conductive layer 141a is electrically connected to a corresponding thin-film transistor.

The sub-conductive layer 141a may include a first conductive material. In an embodiment, for example, the first conductive material included in the sub-conductive layer 141a may be titanium nitride (TiN). TiN may be etched by dry etching. A display device for realizing ultra-high definition includes a pattern by dry etching. Therefore, each layer is desired to include a material that may be etched by dry etching to have a patterned shape. In an embodiment, the sub-conductive layer 141a may be desired to include a material that may be etched simultaneously with other layers to be disposed on the sub-conductive layer 141a to simplify the dry etching process. TiN may be dry-etched by chlorine (Cl)-based gas.

The first reflective layer 142a may be disposed on the sub-conductive layer 141a. The first reflective layer 142a may include a second conductive material. In an embodiment, for example, the second conductive material included in the first reflective layer 142a may be a metal material and may include a material having a property of reflecting light. In other words, the second conductive material may include Al. Al is suitable for dry etching, and may be etched simultaneously with TiN during dry etching with Cl-based gas. Therefore, the first reflective layer 142a and the sub-conductive layer 141a may be etched by a dry etching process using a same gas, thereby reducing time and cost. Commonly or conventionally, the material used for the reflective layer may be a metal material, such as Ag. However, Ag is not suitable for dry etching or may not be etched simultaneously with the material included in the sub-conductive layer 141a with a same gas.

The second conductive material may include an alloy of Al and Ti (Al—Ti alloy). In case of using Al for the second conductive material, a hillock phenomenon may occur. In an embodiment, an alloy of Al and Ti (Al—Ti alloy) is used, such that the hillock phenomenon may be effectively prevented.

The first reflective layer 142a may be apart from the pixel circuit layer CL in a direction perpendicular to the substrate 100. In an embodiment, the first reflective layer 142a may be apart from the pixel circuit layer CL by the thickness of the sub-conductive layer 141a. In such an embodiment, the sub-conductive layer 141a may be disposed between the first reflective layer 142a and the pixel circuit layer CL, and the positional characteristics of the sub-conductive layer 141a have an effect of making light reflected by the first reflective layer 142a unaffected by the sub-conductive layer 141a. Accordingly, light efficiency of the display device according to an embodiment of the invention may be improved.

The inorganic insulating layer 143a may be disposed on the first reflective layer 142a. The inorganic insulating layer 143a may include a transparent inorganic material. The inorganic insulating layer 143a may be disposed to control a light path through which light generated from an emission layer is reflected by the first reflective layer 142a. The inorganic insulating layer 143a may form a light resonance structure by controlling the light path. The inorganic insulating layer 143a may include $SiO_2$ or SiNx. An extinction coefficient in the case of using $SiO_2$ or SiNx will be described below.

In an embodiment, the first transparent electrode layer 144a may cover an upper surface of the inorganic insulating layer 143a. In such an embodiment, the first transparent electrode layer 144a may cover an outer surface of at least one layer disposed below among the layers constituting the first pixel electrode 140a. In such an embodiment, the first transparent electrode layer 144a may directly contact an outer surface of at least one layer disposed below among the layers constituting the first pixel electrode 140a. The first transparent electrode layer 144a may be electrically connected to the sub-conductive layer 141a, and may be electrically connected to the conductive layer 130 through the sub-conductive layer 141a as described above.

In such an embodiment, the first transparent electrode layer 144a may cover an outer surface of the sub-conductive layer 141a. The first transparent electrode layer 144a may directly contact the outer surface of the sub-conductive layer 141a. The first transparent electrode layer 144a may cover an outer surface of the first reflective layer 142a. The first transparent electrode layer 144a may directly contact the outer surface of the first reflective layer 142a. The first transparent electrode layer 144a may cover an outer surface of the inorganic insulating layer 143a. The first transparent electrode layer 144a may directly contact the outer surface of the inorganic insulating layer 143a.

In an embodiment, the first transparent electrode layer 144a may entirely cover outer surfaces of all layers arranged below among the layers constituting the first pixel electrode 140a. In such an embodiment, the first transparent electrode layer 144a may cover the entire outer surface of the sub-conductive layer 141a. The first transparent electrode layer 144a may cover the entire outer surface of the first reflective layer 142a. The first transparent electrode layer 144a may cover the entire outer surface of the inorganic insulating layer 143a. In an embodiment, for example, the first transparent electrode layer 144a may include ITO.

In an embodiment, for example, the thickness of the sub-conductive layer 141a may be less than that of the inorganic insulating layer 143a. In such an embodiment, the thickness of the first reflective layer 142a may be less than that of the inorganic insulating layer 143a. In such an embodiment, the thickness of the sub-conductive layer 141a may be less than that of the first reflective layer 142a.

The thickness of the inorganic insulating layer 143a may have a preset size for a light resonance structure. The thickness of the inorganic insulating layer 143a may have a size corresponding to a wavelength region of light generated from a first emission layer 150a disposed on the first pixel electrode 140a.

The second pixel electrode 140b may be disposed on the pixel circuit layer CL. The second pixel electrode 140b may be apart from the first pixel electrode 140a when viewed in the direction perpendicular to the substrate. The second pixel electrode 140b may include a second reflective layer 141b disposed on the pixel circuit layer CL, and a second transparent electrode layer 142b disposed on the second reflective layer 141b.

The second reflective layer 141b may include a same material as the first reflective layer 142a. The second reflective layer 141b may be formed in a same process as the first reflective layer 142a. The thickness of the second reflective layer 141b may be the same as that of the first reflective layer 142a. The second reflective layer 141b may be electrically connected to the conductive layer 130 through a through hole defined or formed in the organic insulating layer 104.

The second transparent electrode layer 142b may be disposed on the second reflective layer 141b, and the second transparent electrode layer 142b may include a same material as the first transparent electrode layer 144a. The second transparent electrode layer 142b may be formed in a same process as the first transparent electrode layer 144a. The thickness of the second transparent electrode layer 142b may be the same as that of the first transparent electrode layer 144a.

The third pixel electrode 140c may be disposed on the pixel circuit layer CL. The third pixel electrode 140c may be apart from the first pixel electrode 140a and the second pixel electrode 140b when viewed in the direction perpendicular to the substrate. The third pixel electrode 140c may include a third reflective layer 141c disposed on the pixel circuit layer CL, and a third transparent electrode layer 142c disposed on the third reflective layer 141c.

The third reflective layer 141c may include a same material as the first reflective layer 142a. The third reflective layer 141c may be formed in a same process as the first reflective layer 142a. The thickness of the third reflective layer 141c may be the same as that of the first reflective layer 142a. The third reflective layer 141c may be electrically connected to the conductive layer 130 through a through hole defined or formed in the organic insulating layer 104.

The third transparent electrode layer 142c may be disposed on the third reflective layer 141c, and the third transparent electrode layer 142c may include a same material as the first transparent electrode layer 144a. The third transparent electrode layer 142c may be formed in a same process as the first transparent electrode layer 144a. The thickness of the third transparent electrode layer 142c may be the same as that of the first transparent electrode layer 144a.

However, the second pixel electrode 140b and the third pixel electrode 140c described above according to an embodiment are merely an example. In an alternative embodiment, the second pixel electrode 140b and the third pixel electrode 140c may have a same layer structure as the first pixel electrode 140a described above. In an embodiment, as an example, the second pixel electrode 140b may include a second inorganic insulating layer (not shown), and the thickness of the second inorganic insulating layer (not shown) may be set in advance or predetermined to correspond to a wavelength region of light generated from a second emission layer 150b to be described below, where the second emission layer 150b is disposed on the second pixel electrode 140b. In such an embodiment, when the wavelength region of light generated from the second emission layer 150b is different from the wavelength region of light generated from the first emission layer 150a to be described below, the thickness of the second inorganic insulating layer (not shown) may be different from the thickness of the inorganic insulating layer 143a of the first pixel electrode 140a.

A pixel-defining layer 105 may be located on the organic insulating layer 104 and may be disposed to cover the edge of each of the first to third pixel electrodes 140a, 140b, and 140c. In such an embodiment, the pixel-defining layer 105 may cover the edge of each of the first to third pixel electrodes 140a, 140b, and 140c. The pixel-defining layer 105 may be provided with an opening corresponding to the pixel PX, that is, the opening may be defined or formed through the pixel-defining layer 105 to expose at least a central portion of each of the first to third pixel electrodes 140a, 140b, and 140c. The pixel-defining layer 105 may include, for example, an organic material, such as polyimide or HMDSO. In an embodiment, a spacer (not shown) may be disposed on the pixel-defining layer 105.

An intermediate layer 150 and an opposite electrode 160 may be located on the opening of the pixel-defining layer 105. The intermediate layer 150 may include a low-molecular weight or high-molecular weight material. When the intermediate layer 150 includes a low-molecular weight material, the intermediate layer 150 may include a hole injection layer, a hole transport layer, an emission layer (i.e., the first to third emission layers 160a, 160b, and 160c), an electron transport layer and/or an electron injection layer. When the intermediate layer 150 includes a high-molecular weight material, the intermediate layer 150 may have a structure including a hole transport layer and an emission layer.

The emission layer included in the intermediate layer 150 may be arranged to correspond to each of the first to third pixel electrodes 140a, 140b, and 140c. According to an embodiment, all of the emission layers may emit light of a same wavelength region according to the type of display. In an embodiment, for example, the first emission layer 150a may be disposed on the first pixel electrode 140a, the second emission layer 150b may be disposed on the second pixel electrode 140b, and the third pixel electrode 140c may be disposed on the third emission layer 150c. All of the first to third emission layers 150a to 150c may emit light in a same wavelength range, and light in a first wavelength range may be changed into light in a preset wavelength region by a color filter layer (not shown) disposed on the intermediate layer 150. Depending on the thickness of each of the first to third pixel electrodes 140a, 140b, and 140c, the distance between each of the first to third emission layers 150a to 150c and the upper surface of the substrate 100 may vary. In an embodiment, for example, the distance between the first emission layer 150a and the upper surface of the substrate 100 may be greater than the distance between the second emission layer 150b and the substrate 100.

In an alternative embodiment, according to the type of display, the first emission layer 150a may emit light in a first wavelength range, the second emission layer 150b may emit light in a second wavelength range different from the first wavelength range, and the third emission layer 150c may emit light in a third wavelength range different from the first wavelength range and the second wavelength range.

The structure of the intermediate layer 150 is not limited to that described above, and may have various structures. In an embodiment, for example, at least one selected from the layers constituting the intermediate layer 150 may be integrally or commonly formed for all pixels like the opposite electrode 160 to be described below. In an alternative embodiment, the intermediate layer 150 may include a layer patterned to correspond to each of the first to third pixel electrodes 140a, 140b, and 140c.

The opposite electrode 160 may include a light-transmitting conductive layer formed of a light-transmitting conductive oxide, such as ITO, $In_2O_3$, or IZO. The first to third pixel electrodes 140a, 140b, and 140c are used as anodes, and the opposite electrode 160 is used as a cathode. However, the polarity of the electrodes 140a, 140b, and 140c may be applied in reverse.

In an embodiment, the opposite electrode 160 may be disposed above the display area DA and may be disposed over the entire surface of the display area DA. In such an embodiment, the opposite electrode 160 may be integrally formed to cover all pixels. The opposite electrode 160 may electrically contact a common power supply line (not shown) disposed in the peripheral area PA. In an embodiment, the opposite electrode 160 may extend up to a blocking wall 200. A thin-film encapsulation layer TFE may be disposed to entirely cover the display area DA and extend toward the peripheral area PA to cover at least a portion of the peripheral area PA.

The thin-film encapsulation layer TFE may extend to the outside of the common power supply line (not shown). The thin-film encapsulation layer TFE may include a first inorganic encapsulation layer 310, a second inorganic encapsulation layer 330, and an organic encapsulation layer 320 located between the first inorganic encapsulation layer 310 and the second inorganic encapsulation layer 330. Each of the first and second inorganic encapsulation layers 310 and 330 may include at least one inorganic material selected from aluminum oxide, titanium oxide, tantalum oxide, hafnium oxide, zinc oxide, silicon oxide, silicon nitride, and silicon oxynitride.

Each of the first inorganic encapsulation layer 310 and the second inorganic encapsulation layer 330 may have a single or multi-layer structure including the above material. The first inorganic encapsulation layer 310 and the second inorganic encapsulation layer 330 may include a same material as each other or different materials from each other. Thicknesses of the first inorganic encapsulation layer 310 and the second inorganic encapsulation layer 330 may be different from each other. A thickness of the first inorganic encapsulation layer 310 may be greater than a thickness of the second inorganic encapsulation layer 330. Alternatively, a thickness of the second inorganic encapsulation layer 330 may be greater than a thickness of the first inorganic encapsulation layer 310, or thicknesses of the first inorganic encapsulation layer 310 and the second inorganic encapsulation layer 330 may be the same as each other.

The organic encapsulation layer 320 may include a monomer-based material or a polymer-based material. In an embodiment, the polymer-based material may include at least one selected from an acrylic resin, an epoxy resin, polyimide, and polyethylene. In an embodiment, the organic encapsulation layer 320 may include acrylate.

Figure 4:
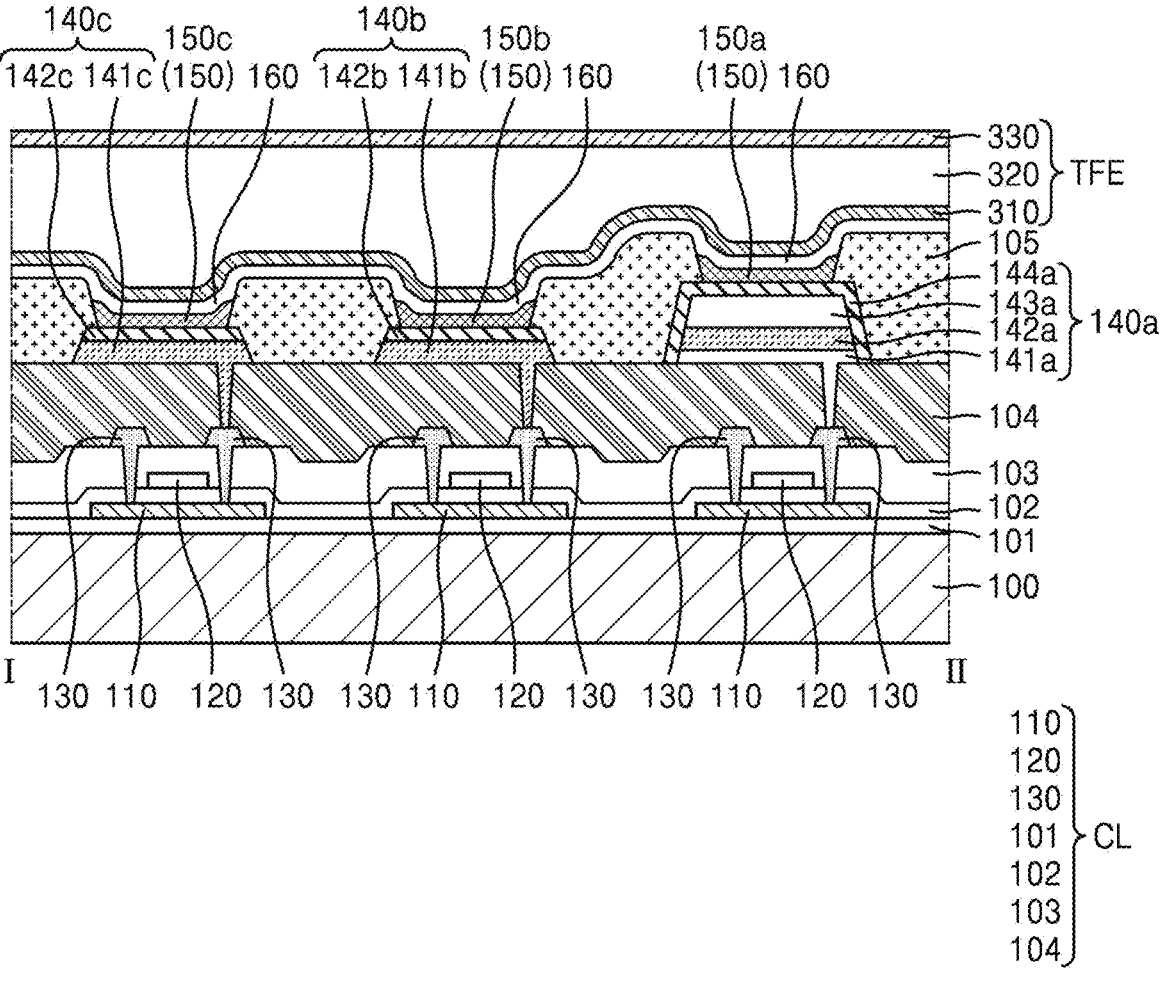
FIG. 4 is a schematic cross-sectional view taken along line I-II of the display panel of FIG. 1 mainly illustrating a pixel electrode according to an alternative embodiment of the invention.

FIG. 4 is a schematic cross-sectional view taken along line I-II of the display panel of FIG. 1 mainly illustrating a pixel electrode according to an alternative embodiment of the invention. For reference, among the descriptions with respect to FIG. 4, any repetitive detailed descriptions of the same or like elements as those described above with respect to FIG. 3 may be omitted or simplified.

As shown in FIG. 4, when viewed in a direction perpendicular to the substrate 100, the area of the upper surface of the first pixel electrode 140a may be less than the area of the lower surface of the first pixel electrode 140a. When viewed in the direction perpendicular to the substrate 100, the area of the upper surface of the second pixel electrode 140b may be less than the area of the lower surface of the second pixel electrode 140b. When viewed in the direction perpendicular to the substrate 100, the area of the upper surface of the third pixel electrode 140c may be less than the area of the lower surface of the third pixel electrode 140c.

When viewed in the direction perpendicular to the substrate 100, the upper surface of the inorganic insulating layer 143a of the first pixel electrode 140a may be disposed inside the upper surface of the first reflective layer 142a. When viewed in the direction perpendicular to the substrate 100, the upper surface of the first reflective layer 142a may be disposed inside the upper surface of the sub-conductive layer 141a.

When viewed in the direction perpendicular to the substrate 100, the upper surface of the second transparent electrode layer 142b may be disposed inside the upper surface of the second reflective layer 141b. When viewed in the direction perpendicular to the substrate 100, the upper surface of the third transparent electrode layer 142c may be disposed inside the upper surface of the third reflective layer 141c.

In such an embodiment, layers constituting each of the pixel electrodes 140a, 140b, and 140c may have smaller areas as being away from the substrate 100 in a direction perpendicular to the upper surface of the substrate 100. Through this configuration, each of the pixel electrodes 140a, 140b, and 140c may have structural stability. In such an embodiment, the areas of the layers respectively constituting the pixel electrodes 140a, 140b, and 140c in FIG. 3 may be the same as each other or different from each other.

Figure 5:
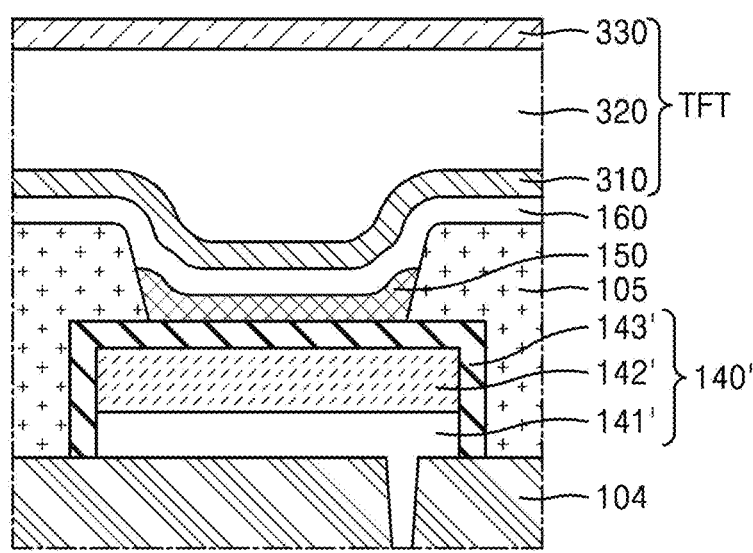
FIG. 5 is a cross-sectional view schematically illustrating an example of a pixel electrode included in a display device according to a comparative example.

FIG. 5 is a cross-sectional view schematically illustrating an example of a pixel electrode included in a display device according to a comparative example.

As shown in FIG. 5, a pixel electrode 140' included in the display device according to the comparative example may be disposed on the pixel circuit layer CL or the organic insulating layer 104, and may include a reflective layer 141' including Al, an inorganic insulating layer 142' disposed on the reflective layer 141', and a transparent electrode layer 143' covering the upper surface of the inorganic insulating layer 142' and directly contacting the outer surface of the reflective layer 141'.

Al is a metal material to which dry etching may be applied, and may be a metal material having a high reflectance. However, because Al has a property of being easily oxidized, Al may be oxidized along the outer surface of the reflective layer 141' to form $Al_2O_3$. As a result, a problem in that the conductivity between the reflective layer 141' and the transparent electrode layer 143' is lowered by $Al_2O_3$ may occur.

Figure 6:
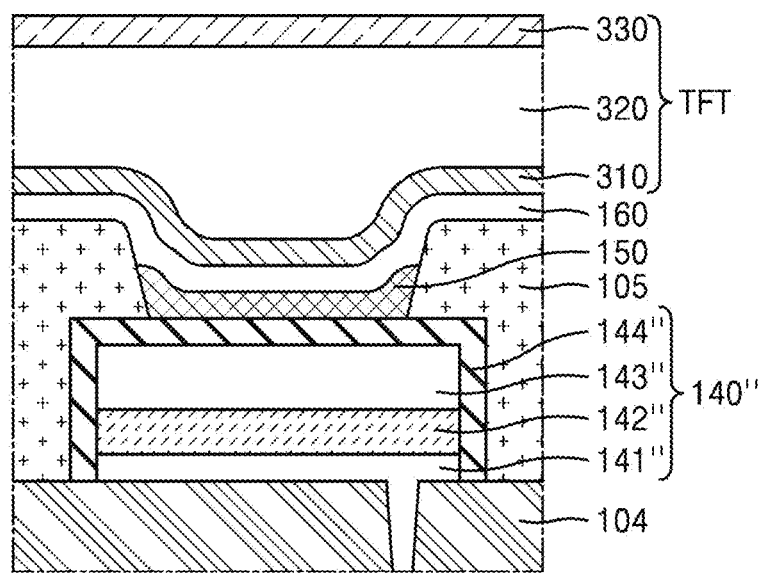
FIG. 6 is a cross-sectional view schematically illustrating another example of a pixel electrode included in a display device according to another comparative example.

FIG. 6 is a cross-sectional view schematically illustrating another example of a pixel electrode included in a display device according to another comparative example.

As shown in FIG. 6, a pixel electrode 140" included in the display device according to another comparative example may be disposed on the pixel circuit layer CL or the organic insulating layer 104, and may include a sub-conductive layer 141" including Ti, a reflective layer 142" disposed on the sub-conductive layer 141" and including Al, an inorganic insulating layer 143" disposed on the reflective layer 142", and a transparent electrode layer 144" covering the upper surface of the inorganic insulating layer 143" and directly contacting the outer surfaces of the sub-conductive layer 141" and the reflective layer 142".

As described above with reference to FIG. 5, because Al has a property of being easily oxidized, Al may be oxidized along the outer surface of the reflective layer 142" to form $Al_2O_3$. As a result, a problem in which the conductivity between the reflective layer 142" and the transparent electrode layer 144" is lowered by $Al_2O_3$ may occur.

In the comparative example, to solve the problem, a sub-conductive layer 141" may be disposed under the reflective layer 142". However, because Ti also has a property of being easily oxidized, Ti may be oxidized along the outer surface of the reflective layer 142" to form $TiO_2$. As a result, a problem in that the conductivity between the sub-conductive layer 141" and the transparent electrode layer 144" is lowered by $TiO_2$ may occur.

Ti is a metal material to which dry etching may be applied, and may be a metal material that may be dry-etched by a same Cl-based etching gas as Al. Therefore, it may be difficult to replace Ti with other metals to solve the above problem.

Therefore, the display device according to an embodiment of the invention includes a sub-conductive layer 141a including TiN, such that dry etching may be possible by using a same Cl-based etching gas as Al without forming $TiO_2$.

Figure 7:
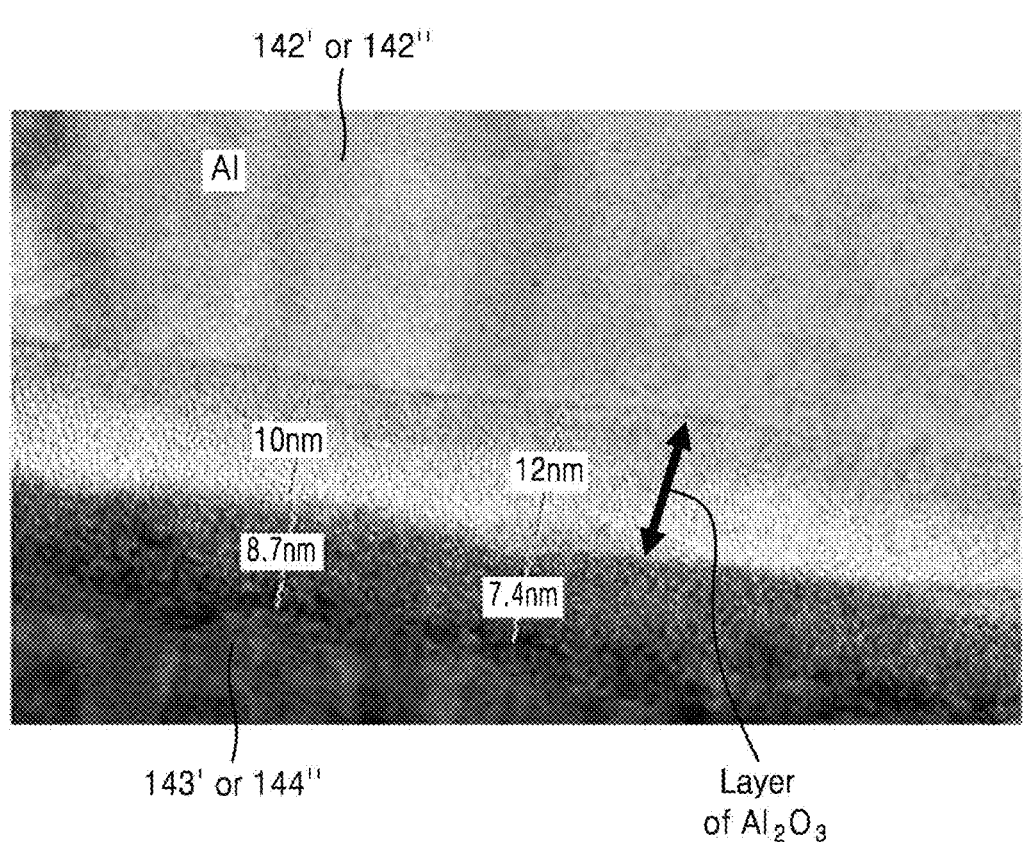
FIG. 7 is a photograph showing an aluminum oxide (Al$_2$O$_3$) layer formed between a reflective layer including aluminum (Al) and a transparent electrode layer in a display device according to the comparative example and the other comparative example.
Figure 8:
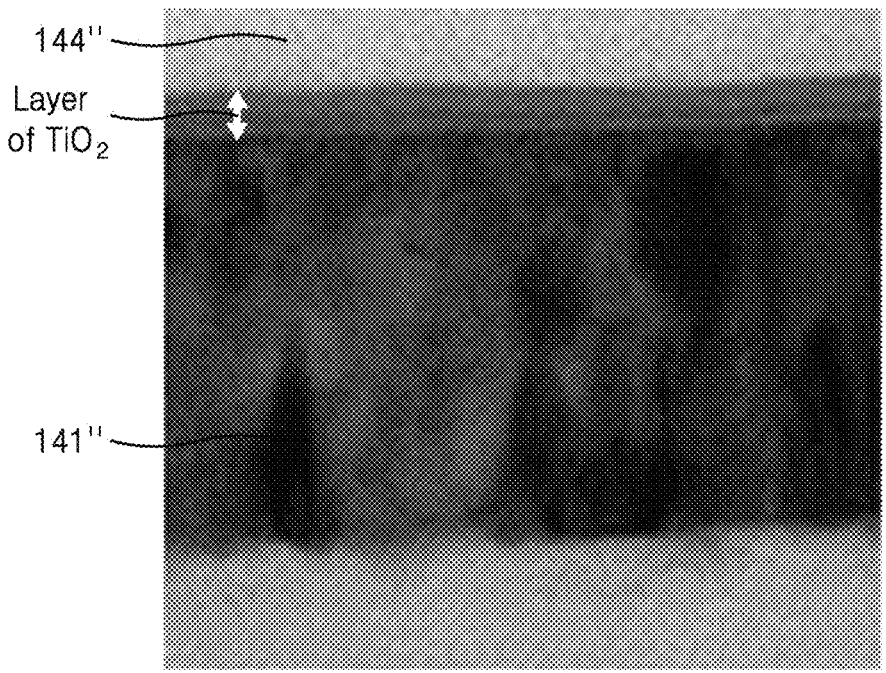
FIG. 8 is a photograph showing a titanium oxide (TiO$_2$) layer formed between a sub-conductive layer including titanium (Ti) and a transparent electrode layer in the display device according to the comparative example and the other comparative example.

FIG. 7 is a photograph showing an $Al_2O_3$ layer formed between a reflective layer including Al and a transparent electrode layer in a display device according to the comparative example and the other comparative example, and FIG. 8 is a photograph showing a $TiO_2$ layer formed between a sub-conductive layer including Ti and a transparent electrode layer in the display device according to the comparative example and the other comparative example.

As shown in FIGS. 7 and 8, it may be understood that an oxide film is formed between the reflective layer 142' or 142" and the transparent electrode layer 143' or 144" and an oxide is formed between the sub-conductive layer 141" and the transparent electrode layer 144". The formed oxide film may cause a problem of reducing the light efficiency of the display device as a whole by lowering electrical conductivity.

Figure 9:
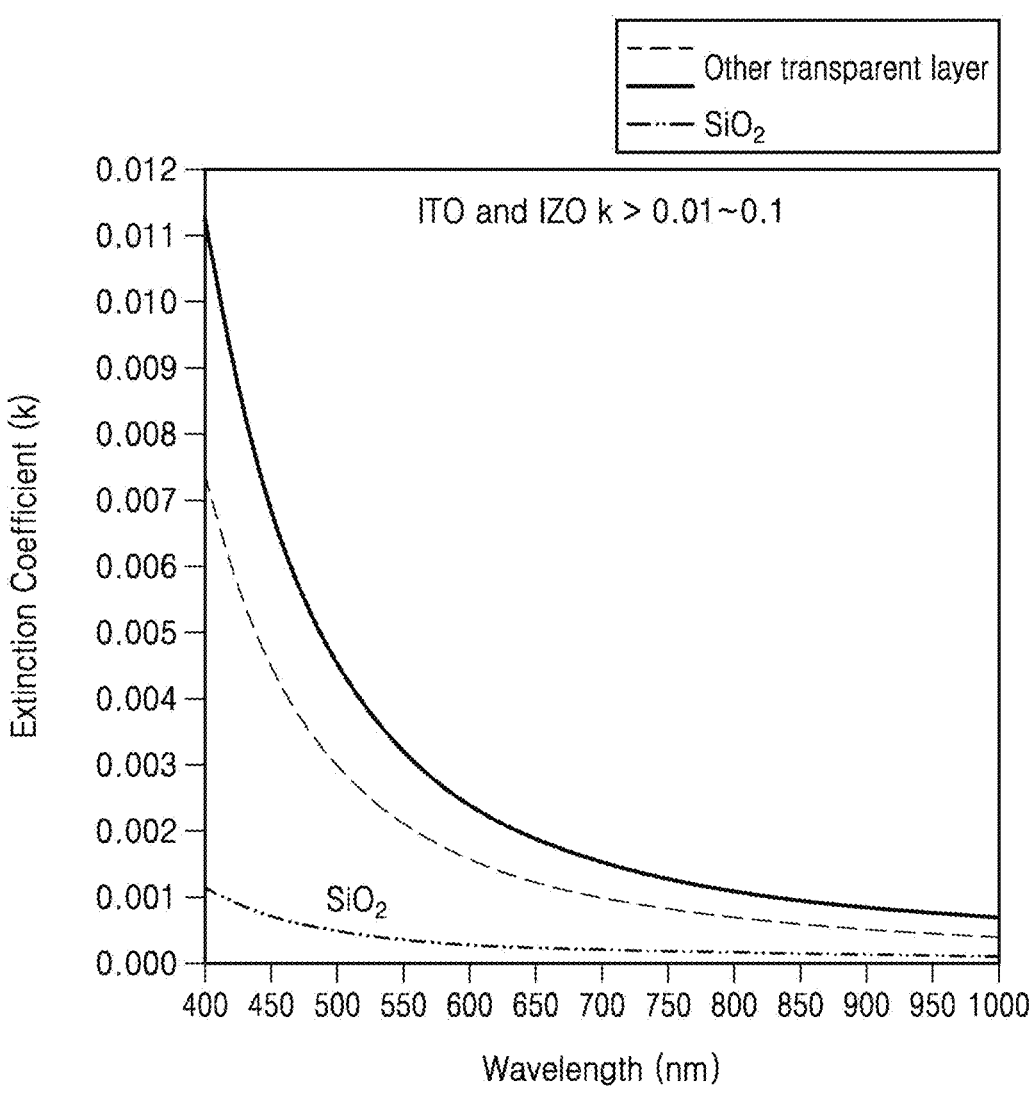
FIG. 9 is a graph showing the extinction coefficient of an inorganic insulating layer in a display device according to an embodiment of the invention.

FIG. 9 is a graph showing the extinction coefficient of an inorganic insulating layer in a display device according to an embodiment of the invention.

As shown in FIG. 9, it may be understood that the inorganic insulating layer 143a including $SiO_2$ or SiNx has a much lower extinction coefficient than a transparent layer including ITO or IZO.

In other words, a transparent layer added to adjust an optical distance may have a relatively large thickness according to the wavelength region of light generated from an emission layer. The transparent layer may also absorb light to some extent, and the light extinction coefficient represents this property. The lower the light extinction coefficient, the less light is absorbed, and thus the light efficiency of light reflected by a reflective layer may be improved.

Hereinafter, a method of manufacturing a display device, according to an embodiment of the invention will be described in detail.

For reference, among the descriptions of the method of manufacturing a display device (hereinafter, the manufacturing method), any repetitive detailed descriptions of the same or like elements as those described above may be omitted. Also, a display device manufactured by the manufacturing method according to an embodiment of the invention may correspond to an embodiment of the display device described above.

FIG. 10 is a flowchart illustrating a method of manufacturing a display device, according to an alternative embodiment of the invention.

As shown in FIG. 10, the manufacturing method according to an embodiment of the invention may include forming a pixel circuit layer including at least one thin-film transistor on a silicon wafer substrate (Operation S1100). In other words, the manufacturing method according to an embodiment of the invention may include forming a pixel circuit layer on a silicon wafer substrate to manufacture an ultra-high resolution display device.

In an embodiment, as described above, the pixel circuit layer may include the semiconductor layer 110, the gate insulating film 102, the gate layer 120, the interlayer insulating film 103, the conductive layer 130, and the organic insulating layer 104. In other words, the pixel circuit layer CL may be a term referring to layers disposed between the substrate described above and a pixel electrode to be described below. Processes for forming the semiconductor layer 110, the gate insulating film 102, the gate layer 120, the interlayer insulating film 103, the conductive layer 130, and the organic insulating layer 104 may be conventionally known deposition processes.

The manufacturing method according to an embodiment of the invention may include, after forming the pixel circuit layer, forming a sub-conductive layer including TIN on the pixel circuit layer and a first reflective layer including Al on the sub-conductive layer by using a dry etching process (Operation S1200).

In such an embodiment, the dry etching process may be an etching process using a Cl-based gas. As described above, the dry etching process may form a fine pattern and may be suitable for manufacturing an ultra-high resolution display device.

The manufacturing method according to an embodiment of the invention may include forming an inorganic insulating layer on the first reflective layer after forming the sub-conductive layer and the first reflective layer (Operation S1300). The inorganic insulating layer 143a may be disposed on the first reflective layer 142a. The inorganic insulating layer 143a may include a transparent inorganic material. The inorganic insulating layer 143a may be disposed to control a light path through which light generated from an emission layer is reflected by the first reflective layer 142a. The inorganic insulating layer 143a may form a light resonance structure by controlling the light path. The inorganic insulating layer 143a may include SiO2 or SiNx. Processes used in the forming the inorganic insulating layer 143a may be conventionally known deposition processes.

The thickness of the inorganic insulating layer 143a may have a preset size for a light resonance structure. The thickness of the inorganic insulating layer 143a may have a size corresponding to a wavelength region of light generated from a first emission layer 150a disposed on the first pixel electrode 140a.

The manufacturing method according to an embodiment of the invention may include, after forming the inorganic insulating layer, forming a first transparent electrode layer covering an upper surface of the inorganic insulating layer and electrically connected to the sub-conductive layer (Operation S1400).

The first transparent electrode layer 144a may cover an upper surface of the inorganic insulating layer 143a. Also, the first transparent electrode layer 144a may cover an outer surface of at least one layer disposed below among the layers constituting the first pixel electrode 140a. In other words, the first transparent electrode layer 144a may directly contact an outer surface of at least one layer disposed below among the layers constituting the first pixel electrode 140a. The first transparent electrode layer 144a may be electrically connected to the sub-conductive layer 141a, and may be electrically connected to the conductive layer 130 through the sub-conductive layer 141a as described above.

In other words, the first transparent electrode layer 144a may cover an outer surface of the sub-conductive layer 141a. The first transparent electrode layer 144a may directly contact the outer surface of the sub-conductive layer 141a. The first transparent electrode layer 144a may cover an outer surface of the first reflective layer 142a. The first transparent electrode layer 144a may directly contact the outer surface of the first reflective layer 142a. The first transparent electrode layer 144a may cover an outer surface of the inorganic insulating layer 143a. The first transparent electrode layer 144a may directly contact the outer surface of the inorganic insulating layer 143a.

The first transparent electrode layer 144a may entirely cover outer surfaces of all layers arranged below among the layers constituting the first pixel electrode 140a. In other words, the first transparent electrode layer 144a may cover the entire outer surface of the sub-conductive layer 141a. The first transparent electrode layer 144a may cover the entire outer surface of the first reflective layer 142a. The first transparent electrode layer 144a may cover the entire outer surface of the inorganic insulating layer 143a. In an embodiment, for example, the first transparent electrode layer 144a may include ITO.

Figure 11:
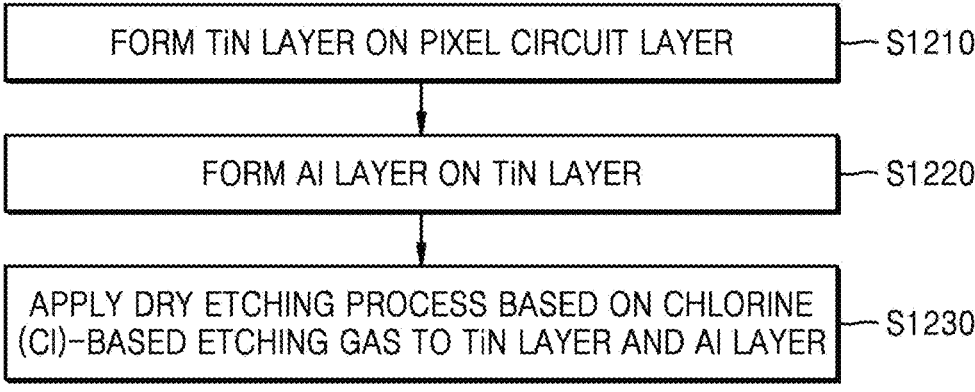
FIG. 11 is a schematic flowchart of an operation of forming a sub-conductive layer and a first reflective layer in the method of manufacturing a display device, according to an embodiment of the invention.

FIG. 11 is a schematic flowchart of an operation of forming the sub-conductive layer and the first reflective layer in the method of manufacturing a display device, according to an embodiment of the invention.

As shown in FIG. 11, the forming (Operation S1200) of the sub-conductive layer and the first reflective layer may include forming a TiN layer on the pixel circuit layer (Operation S1210). The TiN layer may be formed by a conventionally known deposition process. The TiN layer may constitute one layer.

As shown in FIG. 11, the forming (Operation S1200) of the sub-conductive layer and the first reflective layer may further include, after forming the TiN layer, forming an Al layer on the TIN layer (Operation S1220). The Al layer may be formed by a conventionally known deposition process. The Al layer may constitute one layer.

As shown in FIG. 11, the forming (Operation S1200) of the sub-conductive layer and the first reflective layer may further include, after forming the TiN layer and the Al layer, applying a dry etching process based on the Cl-based etching gas to the TiN layer and the Al layer (Operation S1230).

As described above, TiN and Al have a common property of being etched by Cl-based gas. Therefore, when the dry etching process based on the Cl-based etching gas is applied to the TiN layer and the Al layer as in an embodiment of the invention, two layers may be etched at once using the Cl-based etching gas. In order to implement an ultra-high resolution display device, a dry etching process has to be used, and layers etched by a same etching gas are desired to reduce the number of dry etching processes. Therefore, the manufacturing method according to an embodiment of the invention may reduce the number of dry etching processes by forming a TiN layer and an Al layer, thereby efficiently manufacturing a display device.

According to one or more embodiments as described above, it is possible to implement a display device suitable for a dry etching process to implement ultra-high resolution.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a substrate;
a pixel circuit layer disposed on the substrate and including at least one thin-film transistor;
a first pixel electrode including:
a sub-conductive layer disposed on the pixel circuit layer and electrically connected to the at least one thin-film transistor, wherein the sub-conductive layer includes a first conductive material;
a first reflective layer disposed on the sub-conductive layer, wherein the first reflective layer includes a second conductive material;
an inorganic insulating layer disposed on the first reflective layer; and
a first transparent electrode layer covering an upper surface of the inorganic insulating layer and electrically connected to the sub-conductive layer; and
a second pixel electrode including:
a second reflective layer disposed on the pixel circuit layer, wherein the second reflective layer includes the second conductive material; and
a second transparent electrode layer disposed on the second reflective layer,
wherein the second pixel electrode is apart from the first pixel electrode when viewed in a direction perpendicular to the substrate.

2. The display device of claim 1, wherein the first conductive material includes titanium nitride (TiN).

3. The display device of claim 2, wherein the second conductive material includes aluminum (Al).

4. The display device of claim 1, wherein the first transparent electrode layer directly contacts an outer surface of the sub-conductive layer.

5. The display device of claim 4, wherein the first transparent electrode layer entirely covers the outer surface of the sub-conductive layer.

6. The display device of claim 1, wherein the first transparent electrode layer directly contacts an outer surface of the first reflective layer.

7. The display device of claim 6, wherein the first transparent electrode layer entirely covers the outer surface of the first reflective layer.

8. The display device of claim 3, wherein the first reflective layer includes aluminum oxide ($Al_2O_3$) distributed along an outer surface of the first reflective layer.

9. The display device of claim 1, wherein the first transparent electrode layer directly contacts an outer surface of the inorganic insulating layer.

10. The display device of claim 9, wherein the first transparent electrode layer entirely covers the outer surface of the inorganic insulating layer.

11. The display device of claim 1, wherein, when viewed in the direction perpendicular to the substrate, the upper surface of the inorganic insulating layer is disposed inside an upper surface of the first reflective layer.

12. The display device of claim 11, wherein, when viewed in the direction perpendicular to the substrate, the upper surface of the first reflective layer is disposed inside an upper surface of the sub-conductive layer.

13. The display device of claim 1, wherein a distance between an upper surface of the substrate and an upper surface of the first transparent electrode layer is greater than a distance between the upper surface of the substrate and an upper surface of the second transparent electrode layer.

14. The display device of claim 3, wherein the first reflective layer and the second reflective layer include an aluminum-titanium alloy.

15. The display device of claim 3, wherein the inorganic insulating layer includes silicon oxide ($SiO_2$) or silicon nitride ($SiN_x$).

16. The display device of claim 1, wherein the first reflective layer and the sub-conductive layer have a patterned shape formed by a dry etching process using a chlorine (Cl)-based etching gas.

17. The display device of claim 1, wherein the substrate includes a semiconductor substrate.

18. The display device of claim 1, wherein the first reflective layer is apart from the pixel circuit layer in the direction perpendicular to the substrate.

19. The display device of claim 18, wherein the first reflective layer is apart from the pixel circuit layer by a thickness of the sub-conductive layer.

20. The display device of claim 1, further comprising:
a first emission layer disposed on the first pixel electrode; and
a second emission layer disposed on the second pixel electrode,
wherein a distance between the first emission layer and an upper surface of the substrate is greater than a distance between the second emission layer and the substrate.

21. A method of manufacturing a display device, the method comprising:
forming, on a silicon wafer substrate, a pixel circuit layer including at least one thin-film transistor;
forming a sub-conductive layer including titanium nitride (TiN) on the pixel circuit layer and a first reflective layer including aluminum (Al) on the sub-conductive layer by using a dry etching process;
forming an inorganic insulating layer on the first reflective layer; and
forming a first transparent electrode layer covering an upper surface of the inorganic insulating layer and electrically connected to the sub-conductive layer.

22. The method of claim 21, wherein the forming the sub-conductive layer and the first reflective layer includes performing the dry etching process based on a chlorine (Cl)-based etching gas.

23. The method of claim 22, wherein the forming the sub-conductive layer and the first reflective layer includes:
forming a titanium nitride (TiN) layer on the pixel circuit layer;
forming an aluminum (Al) layer on the titanium nitride (TiN) layer; and
applying the dry etching process based on the chlorine (Cl)-based etching gas to the TiN layer and the Al layer.

* * * * *